(12) United States Patent
Chan

(10) Patent No.: US 10,276,259 B2
(45) Date of Patent: Apr. 30, 2019

(54) MEMORY TESTING METHOD AND MEMORY APPARATUS THEREFOR

(71) Applicant: Winbond Electronics Corp., Taichung (TW)

(72) Inventor: Johnny Chan, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/641,343

(22) Filed: Jul. 5, 2017

(65) Prior Publication Data

US 2019/0013084 A1    Jan. 10, 2019

(51) Int. Cl.
  *G11C 29/42*    (2006.01)
  *G11C 29/52*    (2006.01)
  *G11C 29/10*    (2006.01)
  *G11C 29/44*    (2006.01)

(52) U.S. Cl.
  CPC .............. *G11C 29/42* (2013.01); *G11C 29/10* (2013.01); *G11C 29/44* (2013.01); *G11C 29/52* (2013.01)

(58) Field of Classification Search
  CPC ......... G11C 29/42; G11C 29/10; G11C 29/44; G11C 29/52
  USPC ....... 714/720, 718, 719, 722, 723, 742, 715, 714/768, 773, 6.1, 48; 365/200, 201, 365/185.09
  See application file for complete search history.

(56) References Cited

U.S. PATENT DOCUMENTS

| 7,102,544 | B1 * | 9/2006 | Liu ..................... G06F 11/1032 341/50 |
| 8,001,450 | B2 | 8/2011 | Onishi et al. |
| 8,867,289 | B2 * | 10/2014 | Wu .......................... G11C 29/08 365/189.011 |
| 8,938,659 | B2 * | 1/2015 | Wu ...................... G06F 11/1068 714/47.2 |
| 9,911,509 | B2 * | 3/2018 | Motwani ................. G11C 29/82 |
| 2001/0011216 | A1 * | 8/2001 | Lee ........................ G10L 19/005 704/212 |
| 2010/0246297 | A1 * | 9/2010 | Zhang .................... G11C 5/147 365/200 |

(Continued)

FOREIGN PATENT DOCUMENTS

| CN | 104903966 | 9/2015 |
| TW | 200532702 | 10/2005 |

(Continued)

OTHER PUBLICATIONS

"Office Action of Taiwan Counterpart Application", dated Oct. 2, 2018, p. 1-p. 5.

*Primary Examiner* — John J Tabone, Jr.
(74) *Attorney, Agent, or Firm* — JCIPRNET

(57) ABSTRACT

A memory testing method for testing a memory apparatus configured with an auxiliary testing circuit is provided. The memory testing method includes: reading a test data from a memory array of the memory; and encoding the test data into an encoded data by the auxiliary testing circuit, wherein the encoded data comprises a first piece data and a second piece data. The encoded data is encoded to include a first piece data and a second piece data, where the first piece data indicates a number of a binary state in the read test data, and the second piece data indicates an error bit in the read test data. In addition, a memory apparatus for the memory testing method is also provided.

18 Claims, 5 Drawing Sheets

(56) References Cited

U.S. PATENT DOCUMENTS

| | | | | |
|---|---|---|---|---|
| 2011/0251819 A1* | 10/2011 | Ong | ............... | G01R 31/31928 |
| | | | | 702/120 |
| 2013/0297988 A1* | 11/2013 | Wu | ............... | G06F 11/1068 |
| | | | | 714/773 |
| 2014/0126313 A1* | 5/2014 | Wu | ............... | G11C 29/08 |
| | | | | 365/201 |
| 2014/0195867 A1* | 7/2014 | Gollub | ............... | G11C 29/00 |
| | | | | 714/719 |
| 2015/0187436 A1* | 7/2015 | Querbach | ............... | G06F 11/263 |
| | | | | 714/720 |
| 2016/0003904 A1* | 1/2016 | Ong | ............... | G01R 31/3193 |
| | | | | 714/733 |
| 2017/0123662 A1* | 5/2017 | Sharon | ............... | G06F 3/0679 |

FOREIGN PATENT DOCUMENTS

| | | |
|---|---|---|
| TW | I317520 | 11/2009 |
| TW | 201608575 | 3/2016 |

\* cited by examiner

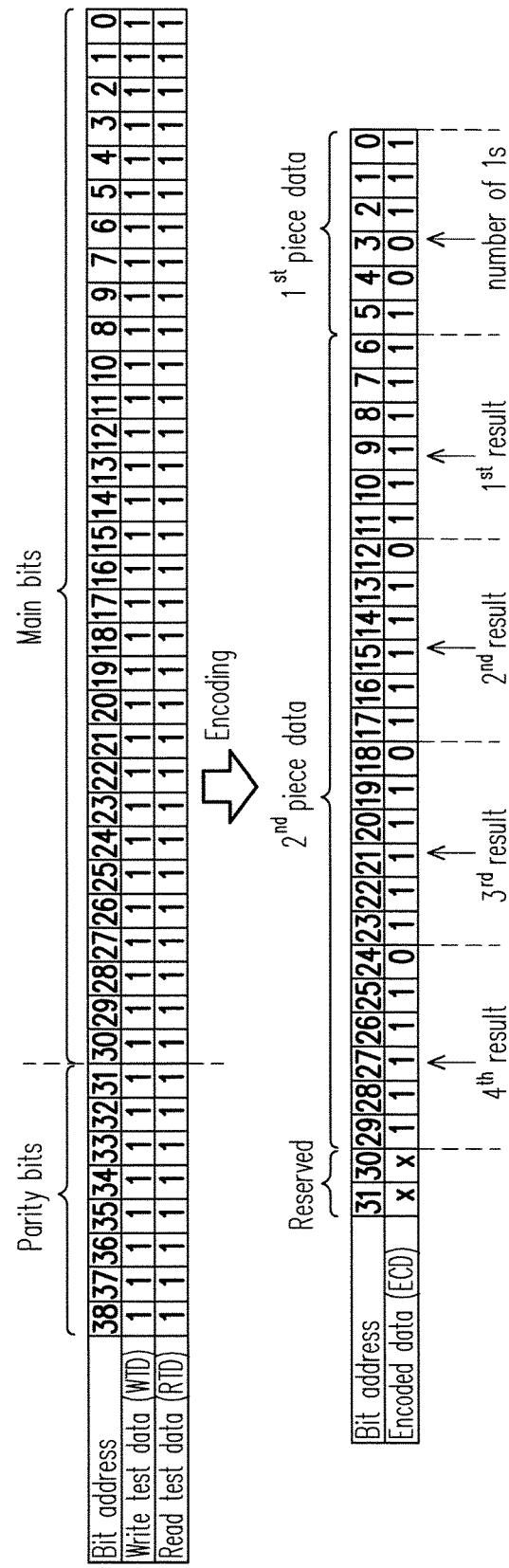

MEMORY TESTING METHOD AND MEMORY APPARATUS THEREFOR

BACKGROUND OF THE INVENTION

1. Field of the Invention

The invention generally relates to a memory storage apparatus, in particular, to a memory testing method and a memory apparatus for the memory testing method.

2. Description of Related Art

Generally, write data to be written to a rewritable non-volatile memory (NVM) adopting an error correcting codes (ECC) scheme may be encoded according to the ECC scheme. Accordingly, data actually written into the memory may include main bits and parity bits of the write data. Data read from the rewritable non-volatile memory may also be processed by a corresponding decoding procedure.

For purposes of improving reliability and quality, comprehensive testing has to be carried out on every memory cells. In the case of the memory adopting the ECC scheme, the main bits and the parity bits should be read separately for testing. Therefore, it takes twice of read times when testing memories adopting the ECC scheme.

SUMMARY OF THE INVENTION

Accordingly, the invention is directed to a memory testing method and a memory apparatus for the memory testing method. By adopting the memory testing method, the testing time may be reduced thus the testing efficiency may be improved.

An exemplary embodiment of the invention provides a memory testing method for testing a memory apparatus configured with an auxiliary testing circuit. The memory testing method includes: reading a test data from a memory array of the memory; and encoding the test data into an encoded data by the auxiliary testing circuit, wherein the encoded data comprises a first piece data and a second piece data. The encoded data is encoded to include a first piece data and a second piece data, where the first piece data indicates a number of a binary state in the read test data, and the second piece data indicates an error bit in the read test data.

An exemplary embodiment of the invention provides a memory apparatus including a connection interface, a memory array, an auxiliary testing circuit, and a memory control circuit. The connection interface is coupled to a host system. The memory array is configured to store test data. The memory control circuit is coupled to the connection interface, the memory array and the auxiliary testing circuit, and configured to read the test data from the memory array. The auxiliary testing circuit is configured to encode the test data read by the memory control circuit into an encoded data. The encoded data in encoded to include a first piece data and a second piece data, where the first piece data indicates a number of a binary state in the read test data, and the second piece data indicates an error bit in the read test data.

Based on the above, by adopting the memory testing method and the memory apparatus provided in the invention, an encoded data may be generated according to test data read from the memory array. The encoded data is encoded to include an information of the number of a binary state in the read test data and an information of the location of an error bit existed in the read test data, such that information needed for testing the memory apparatus may be easily obtained from the encoded data. Accordingly, the testing time for testing the memory apparatus may be reduced thus the testing efficiency may be improved.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a schematic diagram illustrating a target pattern according to an embodiment of the invention.

FIG. 4 is a schematic diagram illustrating test data and the corresponding encoded data according to an embodiment of the invention.

DESCRIPTION OF THE EMBODIMENTS

Figure 1:
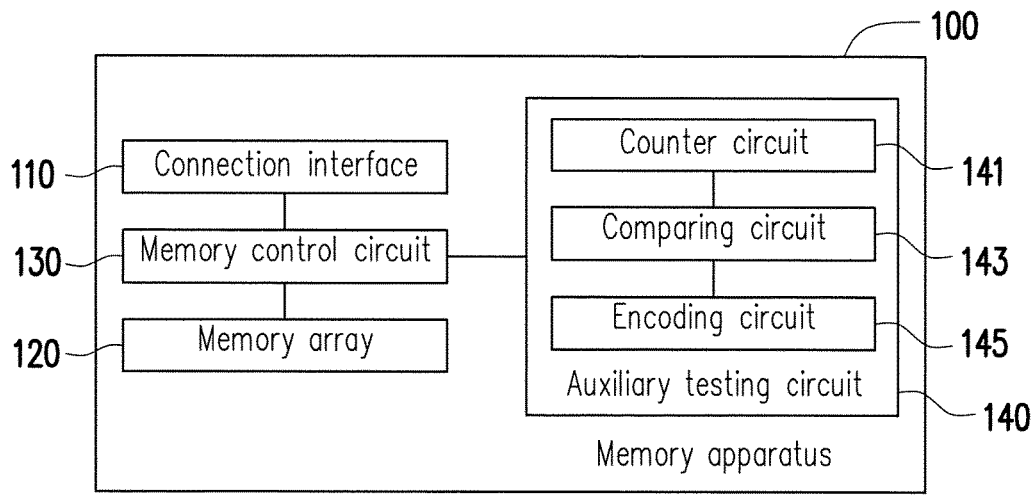
FIG. 1 is a block diagram illustrating a memory apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram illustrating a memory apparatus according to an embodiment of the invention. Referring to FIG. 1, the memory apparatus 100 includes a connection interface 110, a memory array 120, a memory control circuit 130 and an auxiliary testing circuit 140. The memory control circuit 130 is coupled to the connection interface 110, the memory array 120 and the auxiliary testing circuit 140. In the present embodiment, the memory apparatus 100 is a non-volatile memory adopting an ECC scheme.

The connection interface 110 is coupled to the memory control circuit 130 and configured to couple to a host system. In the present embodiment, the connection interface 110 is coupled to the host system for establishing a communication between the host system and the memory control circuit 130. In the present embodiment, the connection interface 110 is compatible with a common flash memory interface (CFI) standard, but the invention is not limited thereto. In other embodiments, the connection interface 110 may be compatible with a serial advanced technology attachment (SATA) standard, a peripheral component interconnect Express (PCI-E) interface standard, a universal serial bus (USB) standard, an integrated device electronics (IDE) interface standard or other suitable standards.

The memory array 120 is coupled to the memory control circuit 130 and includes a plurality of memory cells. In the present embodiment, the memory array 120 is configured to store data, including test data comprised of 32 main bits and 7 parity bits, for example, but which is not limited herein.

The memory control circuit 130 is coupled to the connection interface 110, the memory array 120 and the auxiliary testing circuit 140. In the present embodiment, the memory control circuit 130 receives a test command from the host system for writing a test data comprised of 32 main bits and 7 parity bits into the memory array 120. Then, the memory control circuit 130 and the auxiliary testing circuit 140 may collaboratively perform the memory testing method introduced in the invention for testing the memory array 120. The steps of the memory testing method will be described in detail in the following descriptions.

It is noted that, the auxiliary testing circuit 140 is disposed outside the memory control circuit 130 in the present embodiment, but which is not limited herein. In other embodiments, the auxiliary testing circuit 140 and the memory control circuit 130 may be integrated into a memory controller. It is also noted that the memory control circuit 130 and the auxiliary testing circuit 140 may be implemented in a form of hardware or firmware.

Figure 2:
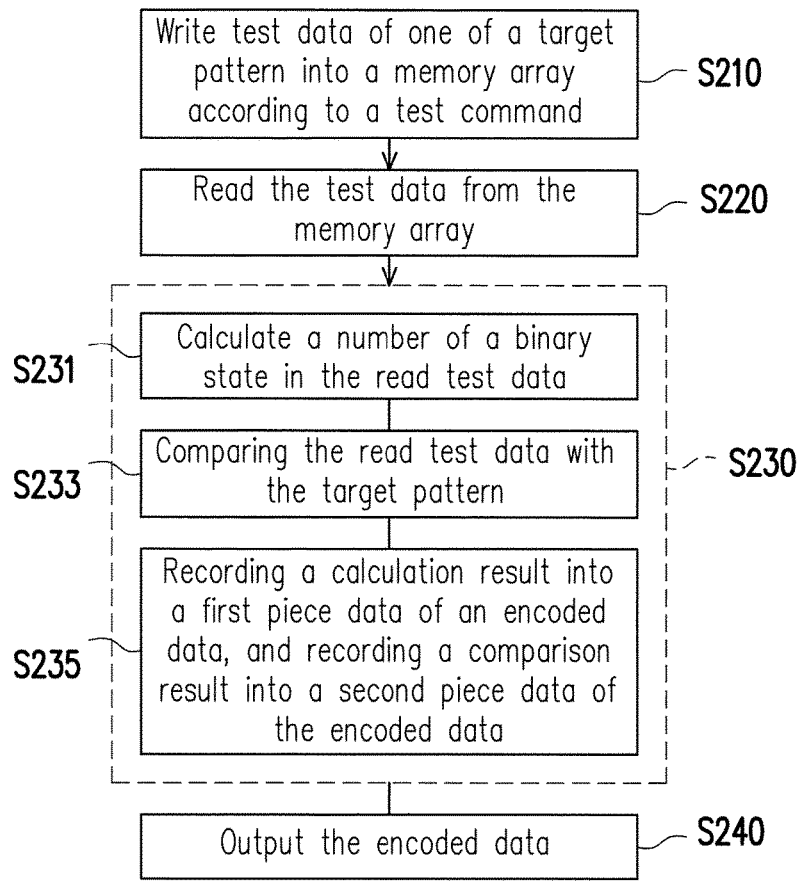
FIG. 2 is a flowchart illustrating a memory testing method according to an embodiment of the invention.

FIG. 2 illustrates a flowchart of a memory testing method according to an embodiment of the invention. The memory testing method may be performed by the memory apparatus 100 of the embodiment of FIG. 1. Therefore, the memory testing method will be illustrated by referring to the aforementioned memory apparatus 100 in the present embodiment.

In step S210, the memory control circuit 130 may receive a test command from the host system through the connection interface 110 for testing the memory array 120 of the memory apparatus 100, and write a test data of one of a target pattern into the memory array 120 according to the test command.

FIG. 3 is a schematic diagram illustrating a target pattern according to an embodiment of the invention. Referring to FIG. 3, in the present embodiment, the target pattern includes an all-one pattern, an all-zero pattern, a checkerboard pattern (i.e., 101010 . . . ), and an inverse checkerboard pattern (i.e., 010101 . . . ). The test data written into the memory array 120 is in the all-one pattern. To be specific, the test data consists of 32 main bits and 7 parity bits, the memory control circuit 130 writes 32 main bits and 7 parity bits into the memory array 120 and all of the written bits are 1's. However, the invention is not limited herein.

In other embodiments, the test data written into the memory array 120 may be in the all-zero pattern, the checkerboard pattern, or the inverse checkerboard pattern of the target pattern. On the other hands, the target pattern may include only part of those patterns, or the target pattern may include other patterns defined by users performing the introduced memory testing method according to their requirements in the other embodiments, which are not limited in the invention.

After writing the test data into the memory array 120, step S220 is entered. In step S220, the memory control circuit 130 may read the test data from the memory array 120. In the present embodiment, the memory control circuit 130 may apply a read voltage on the memory cells storing the test data, so as to read all 39 bits of the test data from the memory array 120. It is noted that the test data read in the step S220 may not be identical to the test data written in the step S210 due to various reasons such as abnormal bits existed in the memory array 120, but which is not limited herein. Therefore, it is helpful for testing the memory apparatus 100 by finding out the abnormal bits/cells existed in the memory array 120.

In step S230, the auxiliary testing circuit 140 may encode the read test data into an encoded data. To be specific, the encoded data includes a first piece data and a second piece data, where the first piece data indicates a number of a binary state in the read test data, and the second piece data indicates an error bit in the read test data. As a result, the margin read voltage of the memory array 120 may be figured out by referring to the first piece data of the encoded data, and the abnormal bits/cells existed in the memory array 120 may be easily found and fixed by referring to the second piece data of the encoded data.

In the present embodiment, the step S230 further includes steps S231 to S235, respectively performed by a counter circuit, a comparing circuit and an encoding circuit included in the auxiliary testing circuit 140.

In the step S231, the counter circuit may calculate the number of the binary state in the read test data. In the present embodiment, the counter circuit may calculate the number of 1's in the read test data for recording the calculation result into the first piece data of the encoded data, but which is not limited herein. In other embodiment, the counter circuit may calculate the number of 0's in the read test data.

In the step S233, the comparing circuit may compare the read test data with the target pattern for finding the error bits in the read test data. In the present embodiment, the comparing circuit may compare the read test data with each target pattern shown in FIG. 3 to obtain a comparison result. To be specific, the comparing circuit may compare the read test data with the all-one pattern to obtain a first result, compare the read test data with the all-zero pattern to obtain a second result, compare the read test data with the checkerboard pattern to obtain a third result, and compare the read test data with the inverse checkerboard pattern to obtain a fourth result. The first, second, third and fourth result may include the information of the bit differences between the read test data and each pattern.

In the present embodiment, the test data written in the step S210 is in the all-one pattern. Therefore, the first result may include the information of the error bit in the test data read in the step S220, where said information may include the number and the location of the error bit existed in the read test data, but which is not limited thereto.

In the step S235, the encoding circuit may record the calculation result of the step S231 into the first piece data of the encoded data and record the comparison result of the step S233 into the second piece data of the encoded data. Regarding the first piece data, the number of 1's in the read test data is recorded therein in the present embodiment. Regarding the second piece data, the first result, the second result, the third result and the fourth result are recorded therein in the present embodiment. Accordingly, the encoded data may be completed in the step S230.

Figure 5:
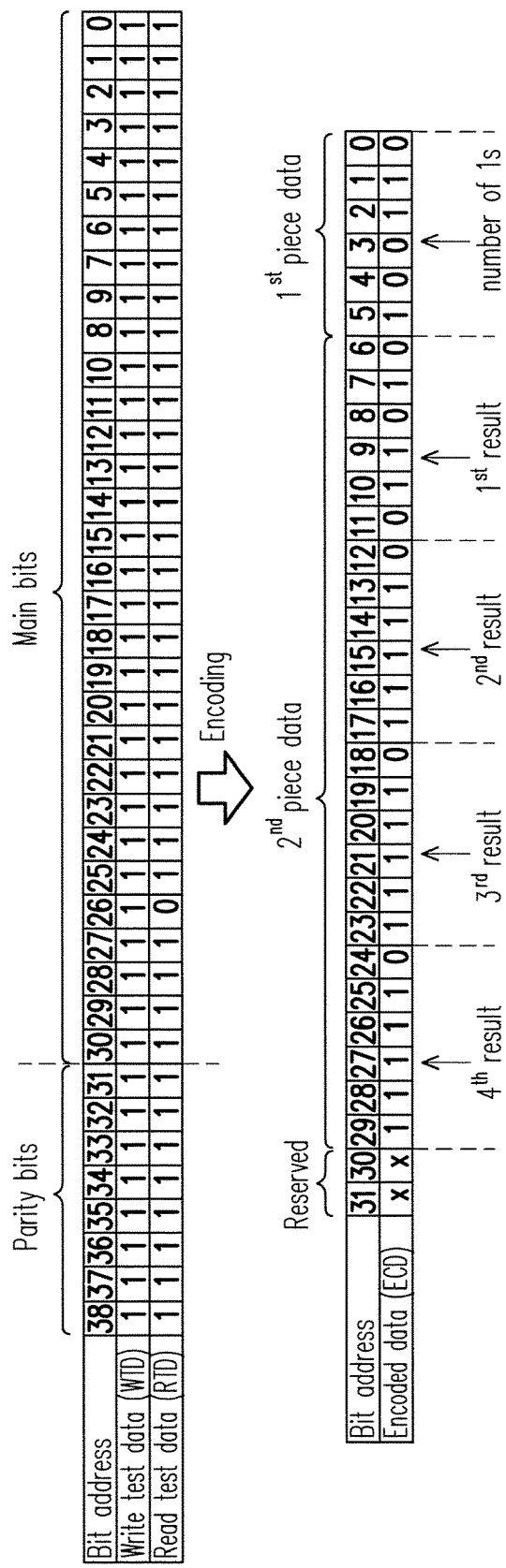
FIG. 5 is a schematic diagram illustrating test data and the corresponding encoded data according to an embodiment of the invention.
Figure 6:
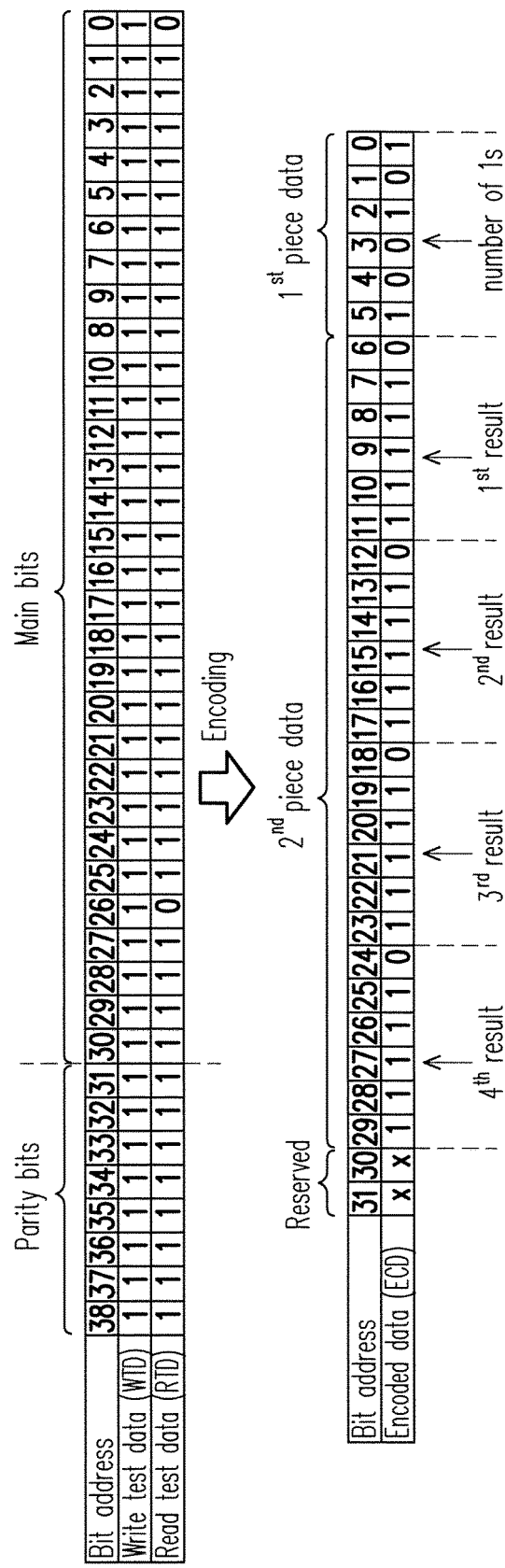
FIG. 6 is a schematic diagram illustrating test data and the corresponding encoded data according to an embodiment of the invention.

Several cases of the present embodiment are described in detail below accompanied with FIGS. 4-6. FIGS. 4-6 are schematic diagrams illustrating test data and the corresponding encoded data according to an embodiment of the invention.

Referring to FIG. 4, all bits of the read test data RTD are 1's, which means that the test data RTD read in the step S220 is identical to the test data WTD written in the step S210. In the present embodiment, the encoded data is a 32-bit data, where the first six bits (i.e., the $1^{th}$ to $6^{th}$ bits) are used to record the first piece data. To be specific, the number of 1's in the read test data RTD is 39, therefore the first piece data is recorded as "39" (i.e., "100111" in binary).

In the present embodiment, the $7^{th}$ to $30^{th}$ bits of the encoded data are used to record the second piece data. In which, the $7^{th}$ to $12^{th}$ bits are used to record the first result, the $13^{th}$ to $18^{th}$ bits are used to record the second result, the $19^{th}$ to $24^{th}$ bits are used to record the third result, and the $25^{th}$ to $30^{th}$ bits are used to record the fourth result. Each result is recorded as the location of the difference between compared corresponding target pattern and the read test data RTD1 when there is only one different bit therebetween.

It is noted that the read test data is a 39-bit data in the present embodiment, therefore numbers of 0 to 38 (i.e., "000000" to "100110" in binary) are enough for recording the location of the different bit. Accordingly, when there is no different bit between the read test data and the compared corresponding target pattern, it can be recorded as "111111" in the present embodiment. On the other hand, when there are more than two different bits between the read test data and the compared corresponding target pattern, it can be recorded as "111110" in the present embodiment.

Referring back to FIG. 4, since the test data written in the step S210 is in the all-one pattern, the first result may show that there is no different bit between the read test data RTD and the all-one pattern. Accordingly, the $7^{th}$ to $12^{th}$ bits of the encoded data ECD is recorded as "111111" for indicating no different bit. Since the test data written in the step S210 is in the all-one pattern as well, no different bit between the read test data RTD and the all-one pattern is also representing no error bit existed in the read test data RTD. Accordingly, the "111111" recorded in the $7^{th}$ to $12^{th}$ bits of the encoded data ECD is also indicating the no-error-bit information.

The comparing circuit also compare the read test data RTD with the all-zero pattern to obtain the second result. The second result may show that there are more than one different bits (i.e., 39 different bits) between the read test data RTD and the all-zero pattern. Accordingly, the $13^{th}$ to $18^{th}$ bits of the encoded data ECD is recorded as "111110" for indicating more than one different bit between the read test data RTD and the all-zero pattern. Similarly, the $19^{th}$ to $24^{th}$ bits of the encoded data ECD is recorded as "111110" for indicating more than one different bit between the read test data RTD and the checkerboard pattern, and the $25^{th}$ to $30^{th}$ bits of the encoded data ECD is recorded as "111110" for indicating more than one different bit between the read test data RTD and the inverse checkerboard pattern. Finally, the encoding circuit may generate the encoded data of "xx111110111110111110111111100111". The $31^{th}$ and $32^{th}$ bits of the encoded data are marked as "xx" since these two bits are reserved and bearing no information in the present embodiment.

Referring to FIG. 5, the $27^{th}$ bit of the read test data RTD is 0, and the other bits of the read test data RTD are 1's. The different bit between the read test data RTD and the all-one pattern (i.e., error bit) is the $27^{th}$ bit, where the bit address thereof is 26.

Based on the read test data RTD shown in FIG. 5, the $1^{th}$ to $6^{th}$ bits of the encoded data ECD is recorded as "100110" for indicating total 38 bits of 1's are read. On the other hand, the $7^{th}$ to $12^{th}$ bits of the encoded data ECD is recorded as "011010" for indicating the bit address of the error bit (i.e., 26) in the read test data RTD. Besides, the $13^{th}$ to $18^{th}$ bits of the encoded data ECD is recorded as "111110" for indicating more than one different bit between the read test data RTD and the all-zero pattern. Similarly, the $19^{th}$ to $24^{th}$ bits of the encoded data ECD is recorded as "111110" for indicating more than one different bit between the read test data RTD and the checkerboard pattern, and the $25^{th}$ to $30^{th}$ bits of the encoded data ECD is recorded as "111110" for indicating more than one different bit between the read test data RTD and the inverse checkerboard pattern. Finally, the encoding circuit may generate the encoded data of "xx111110111110111110011010100110". The $31^{th}$ and $32^{th}$ bits of the encoded data are marked as "xx" for the same reason described before.

Referring to FIG. 6, the $1^{th}$ and $27^{th}$ bits of the read test data RTD are 0's, and the other bits of the read test data RTD are 1's. The different bits between the read test data RTD and the all-one pattern (i.e., error bits) are the $1^{th}$ and $27^{th}$ bits, where the bit addresses thereof are 0 and 26.

Based on the read test data RTD shown in FIG. 6, the $1^{th}$ to $6^{th}$ bits of the encoded data ECD is recorded as "100101" for indicating total 37 bits of 1's are read. On the other hand, the $7^{th}$ to $12^{th}$ bits of the encoded data ECD is recorded as "111110" for indicating more than one different bits between the read test data RTD and the all-one pattern. Accordingly, the "111110" recorded in the $7^{th}$ to $12^{th}$ bits of the encoded data ECD is also indicating the multiple-error-bits information. Besides, the $13^{th}$ to $18^{th}$ bits of the encoded data ECD is recorded as "111110" for indicating more than one different bit between the read test data RTD and the all-zero pattern. Similarly, the $19^{th}$ to $24^{th}$ bits of the encoded data ECD is recorded as "111110" for indicating more than one different bit between the read test data RTD and the checkerboard pattern, and the $25^{th}$ to $30^{th}$ bits of the encoded data ECD is recorded as "111110" for indicating more than one different bit between the read test data RTD and the inverse checkerboard pattern. Finally, the encoding circuit may generate the encoded data of "xx111110111110111110111110100101". The $31^{th}$ and $32^{th}$ bits of the encoded data are marked as "xx" for the same reason described before.

According to the embodiment described in the above, the encoding circuit may encode the test data read from the memory array 120 into the encoded data. Then, in step S240, the memory control circuit 130 may output the encoded data to the host system through the connection interface 110 for later use. For example, the user or tester performing the introduced memory testing method may figure out the location of error bit in the read test data by referring to the second piece data of the encoded data. Based on such information, the user or tester may replace a certain bit line for fixing the abnormal bit.

It is noted that, in the present embodiment of writing test data in the all-one pattern, the user or tester who cares about the abnormal bit existed in the memory array 120 may focused in the $7^{th}$ to $12^{th}$ bits of the encoded data ECD and not aware of the information recorded in the $13^{th}$ to $32^{th}$ bits of the encoded data ECD. In the other words, the encoded data ECD may include more than enough information for one testing the memory apparatus 100.

In the aforementioned embodiment, the test data written into the memory array 120 is in the all-one pattern. However, the invention is not limited thereto. In other embodiments, the test command may require the test data to be written in other patterns.

Figure 7:
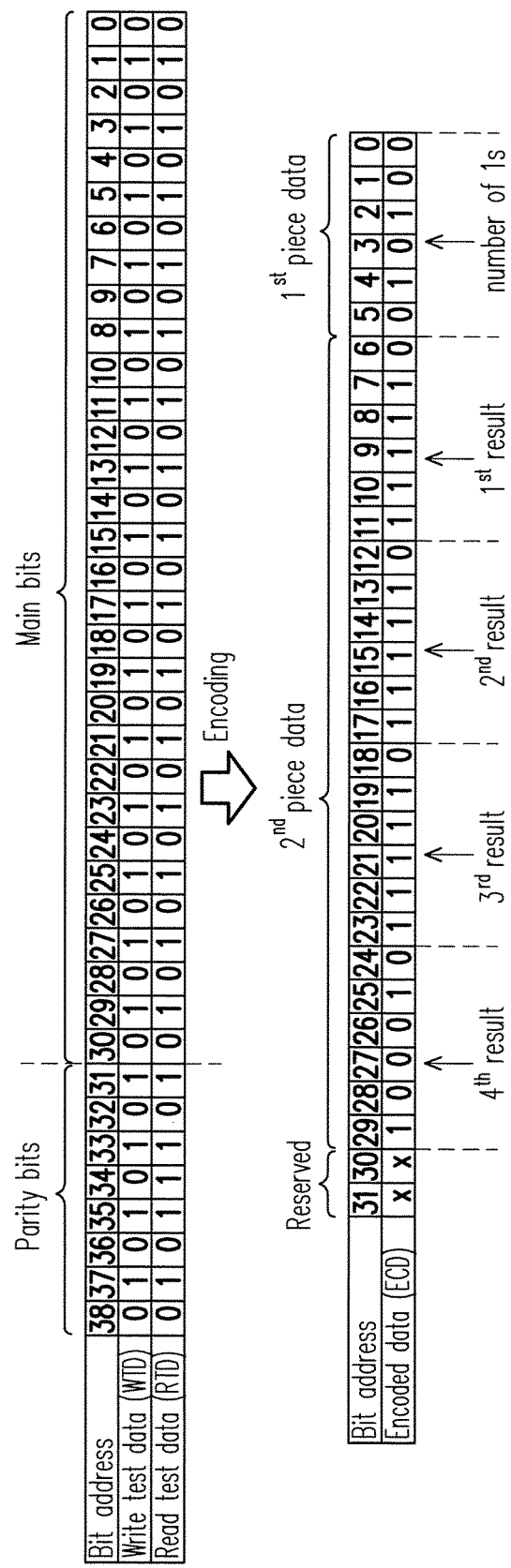
FIG. 7 is a schematic diagram illustrating test data and the corresponding encoded data according to another embodiment of the invention.

FIG. 7 is a schematic diagram illustrating test data and the corresponding encoded data according to another embodiment of the invention. Different from the aforementioned embodiment, the test data WTD written into the memory array 120 is in the inverse checkerboard pattern in the embodiment of FIG. 7.

In the embodiment, the test data RTD read from the memory array 120 is "010111010101010101010101010101010101010", which means that there is one error bit in the bit address of 34.

Accordingly, the to $6^{th}$ bits of the encoded data ECD is recorded as "010100" for indicating total 20 bits of 1's are read. The $7^{th}$ to $12^{th}$ bits of the encoded data ECD is recorded as "111110" for indicating more than one different bits between the read test data RTD and the all-one pattern. The $13^{th}$ to $18^{th}$ bits of the encoded data ECD is recorded as "111110" for indicating more than one different bit between the read test data RTD and the all-zero pattern. Similarly, the $19^{th}$ to $24^{th}$ bits of the encoded data ECD is recorded as "111110" for indicating more than one different bit between the read test data RTD and the checkerboard pattern, and the $25^{th}$ to $30^{th}$ bits of the encoded data ECD is recorded as "100010" for indicating the bit address of the error bit (i.e., 34) in the read test data RTD. Finally, the encoding circuit may generate the encoded data of "xx100010111110111110111110010100". The $31^{th}$ and $32^{th}$ bits of the encoded data are marked as "xx" for the same reason described before.

According to the above, the encoding circuit may generate the encoded data according to various patterns of the read test data fed into the auxiliary testing circuit 140, and the encoded data may include enough information needed for the user or tester who is testing the memory array 120 of the memory apparatus 100.

In summary, by adopting the memory testing method and the memory apparatus provided in the invention, an encoded data may be generated according to a read after write (RAW) data. The encoded data is encoded to include an information of the number of a binary state in the RAW data and an information of the location of an error or bit existed in the RAW data, such that information needed for testing the memory apparatus may be easily obtained from the encoded data. In one embodiment of the invention, a second read operation for reading the parity bits is not needed anymore for completely testing an ECC memory apparatus. Accordingly, the testing time for testing the memory array of the memory apparatus may be reduced thus the testing efficiency may be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory testing method for testing a memory apparatus configured with an auxiliary testing circuit, the memory testing method comprising:
   writing a test data of one of a target pattern into a memory array by a memory control circuit according to a test command;
   after writing the test data into the memory array, reading the test data from the memory array of the memory apparatus by the memory control circuit;
   encoding the test data into an encoded data by the auxiliary testing circuit, wherein the encoded data comprises a first piece data and a second piece data, wherein the first piece data indicates a number of a binary state in the read test data, and the second piece data indicates an error bit in the read test data; and
   outputting the encoded data to a host system through a connection interface.

2. The memory testing method as claimed in claim 1, wherein the memory apparatus is an ECC memory apparatus.

3. The memory testing method as claimed in claim 1, wherein the target pattern comprises at least one of an all-one pattern, an all-zero pattern, a checkerboard pattern, and an inverse checkerboard pattern.

4. The memory testing method as claimed in claim 1, wherein the step of encoding the test data into the encode data comprises:
   calculating the number of the binary state in the read test data;
   comparing the read test data with the target pattern; and
   recording a calculation result into the first piece data of the encoded data and recording a comparison result into the second piece data of the encoded data.

5. The memory testing method as claimed in claim 4, wherein the step of recording the comparison result into the second piece data of the encoded data comprises:
   according to the comparison result, recording a location of the error bit into the second piece data when the read test data has one error bit.

6. The memory testing method as claimed in claim 5, wherein the step of recording the comparison result into the second piece data of the encoded data further comprises:
   according to the comparison result, recording a no-error-bit information into the second piece data when the read test data has no error bit; and
   according to the comparison result, recording a multiple-error-bits information into the second piece data when the read test data has more than one error bits.

7. The memory testing method as claimed in claim 4, wherein the step of calculating the number of the binary state in the read test data comprises:
   calculating a number of 1's or 0's in the read test data.

8. The memory testing method as claimed in claim 7, wherein the step of comparing the read test data and the target pattern comprises:
   comparing the read test data with an all-one pattern, an all-zero pattern, a checkerboard pattern, and an inverse checkerboard pattern to obtain a first result, a second result, a third result, and a fourth result respectively,
   wherein the step of recording the calculation result into the first piece data of the encoded data and recording the comparison result into the second piece data of the encoded data comprises:
   recording the number of 1's or 0's in the read test data into the first piece data of the encoded data; and
   recording the first result, the second result, the third result and the fourth result into the second piece data of the encoded data.

9. The memory testing method as claimed in claim 8, wherein the test data is a 39-bit data comprising seven parity bits, the encoded data is a 32-bit data, and each of the number of 1's in the read test data, the first result, the second result, the third result, and the fourth result is recorded as a 6-bit data.

10. A memory apparatus, comprising:
    a connection interface, coupled to a host system;
    a memory array, configured to store a test data;
    an auxiliary testing circuit; and
    a memory control circuit, coupled to the connection interface, the memory array and the auxiliary testing circuit,
    wherein the memory control circuit is configured to write the test data of one of a target pattern into the memory array according to a test command, after writing the test data into the memory array read the test data from the memory array, wherein the auxiliary testing circuit is configured to encode the test data read by the memory control circuit into an encoded data, wherein the encoded data comprises a first piece data and a second piece data, the first piece data indicates a number of a binary state in the read test data, and the second piece data indicates an error bit in the read test data, wherein the encoded data is outputted to the host system through the connection interface.

11. The memory apparatus as claimed in claim 10, wherein the memory apparatus is an ECC memory apparatus adopting an ECC scheme.

12. The memory apparatus as claimed in claim 10, wherein the target pattern comprises at least one of an all-one pattern, an all-zero pattern, a checkerboard pattern, and an inverse checkerboard pattern.

13. The memory apparatus as claimed in claim 10, wherein the auxiliary testing circuit comprises:
 a counter circuit, configured to calculate the number of the binary state in the test data read by the memory control circuit; and
 a comparing circuit, configured to compare the read test data with the target pattern; and
 an encoding circuit, coupled to the counter circuit and the comparing circuit, and configured to record a calculation result of the counter circuit into the first piece data of the encoded data and record a comparison result of the comparing circuit into the second piece data of the encoded data.

14. The memory apparatus as claimed in claim 13, wherein according to the comparison result of the comparing circuit, the encoding circuit records a location of the error bit into the second piece data when the read test data has one error bit.

15. The memory apparatus as claimed in claim 14, wherein according to the comparison result of the comparing circuit, the encoding circuit records a no-error-bit information into the second piece data when the read test data has no error bit, and records a multi-error-bit information into the second piece data when the read test data has more than one error bits.

16. The memory apparatus as claimed in claim 13, wherein the counter circuit is configured to calculate a number of 1's or 0's in the read test data.

17. The memory apparatus as claimed in claim 16, wherein the comparing circuit is configured to compare the read test data with an all-one pattern, an all-zero pattern, a checkerboard pattern, and an inverse checkerboard pattern to obtain a first result, a second result, a third result, and a fourth result respectively,
 wherein the encoding circuit is configured to record the number of 1's or 0's in the read test data into the first piece data of the encoded data, and record the first result, the second result, the third result and the fourth result into the second piece data of the encoded data.

18. The memory apparatus as claimed in claim 17, wherein the test data is a 39-bit data comprising seven parity bits, the encoded data is a 32-bit data, and each of the number of 1's in the read test data, the first result, the second result, the third result, and the fourth result is recorded as a 6-bit data.

* * * * *